(12) United States Patent
Cabrera et al.

(10) Patent No.: US 10,270,396 B2
(45) Date of Patent: Apr. 23, 2019

(54) PUSH-PULL AMPLIFICATION SYSTEMS AND METHODS

(71) Applicant: GATESAIR, INC., Mason, OH (US)

(72) Inventors: George Cabrera, Mason, OH (US); Dmitri Borodulin, South Lebanon, OH (US)

(73) Assignee: GATESAIR, INC., Mason, OH (US)

( * ) Notice: Subject to any disclaimer, the term of this patent is extended or adjusted under 35 U.S.C. 154(b) by 0 days.

(21) Appl. No.: 15/495,202

(22) Filed: Apr. 24, 2017

(65) Prior Publication Data

US 2018/0309411 A1 Oct. 25, 2018

(51) Int. Cl.
*H03F 1/02* (2006.01)
*H03F 1/56* (2006.01)
(Continued)

(52) U.S. Cl.
CPC .............. *H03F 1/0288* (2013.01); *H03F 1/42* (2013.01); *H03F 1/565* (2013.01); *H03F 3/193* (2013.01); *H03F 3/21* (2013.01); *H03F 3/265* (2013.01); *H03F 2200/06* (2013.01); *H03F 2200/09* (2013.01); *H03F 2200/387* (2013.01); *H03F 2200/42* (2013.01); *H03F 2200/451* (2013.01); *H03F 2200/534* (2013.01); *H03F 2200/541* (2013.01)

(58) Field of Classification Search
USPC .................... 330/295, 124 R, 84, 286, 53–54
See application file for complete search history.

(56) References Cited

U.S. PATENT DOCUMENTS

| 5,959,857 A | 9/1999 | Nagahara |
| 5,973,556 A | 10/1999 | Su |

(Continued)

FOREIGN PATENT DOCUMENTS

| EP | 2955843 B1 | 12/2015 |
| WO | 2013/133215 A1 | 9/2013 |
| WO | 2015/108492 A1 | 7/2015 |

OTHER PUBLICATIONS

Walter Sneijers, "Doherty Architectures in UHF White Paper"; Paper; www.ampleon.com; Aug. 26, 2016; 14 pgs.

(Continued)

*Primary Examiner* — Hieu P Nguyen
(74) *Attorney, Agent, or Firm* — Tarolli, Sundheim, Covell & Tummino LLP

(57) ABSTRACT

An amplification system includes a differential output circuit that provides an amplified output to drive a load. A main amplifier is coupled to a terminal of the differential output circuit via a main path, corresponding to a transmission line. A peak amplifier is coupled to another terminal of the differential output circuit via a peak path, corresponding to a transmission line. In a single-ended mode while the peak amplifier is deactivated for amplification purposes, the peak path performs an impedance inversion to effectively ground the other terminal of the differential output circuit. In a differential mode, each of the peak amplifier and the main amplifier operates to conduct current to respective terminals of the differential output circuit and each of the main path and the peak path provides a predetermined output impedance to the differential output circuit.

17 Claims, 8 Drawing Sheets

(51) Int. Cl.
  *H03F 3/193*  (2006.01)
  *H03F 3/21*   (2006.01)
  *H03F 3/26*   (2006.01)
  *H03F 1/42*   (2006.01)

(56) References Cited

U.S. PATENT DOCUMENTS

| | | |
|---|---|---|
| 6,895,227 B1 | 5/2005 | Moliere |
| 7,068,096 B2 | 6/2006 | Chu |
| 7,649,413 B2 | 1/2010 | Shiikuma |
| 7,859,336 B2 | 12/2010 | Markowski et al. |
| 7,961,048 B2 * | 6/2011 | Oakley ............ H03F 1/0288 330/124 R |
| 8,665,025 B2 | 3/2014 | Cabrera et al. |
| 8,912,846 B2 * | 12/2014 | Karthaus ........... H01Q 1/246 330/124 R |
| 9,124,217 B2 * | 9/2015 | Xue ................. H03F 1/0288 |
| 9,698,750 B2 * | 7/2017 | Qureshi ............ H03H 7/42 |
| 2006/0012423 A1 | 1/2006 | Smith |
| 2010/0259328 A1 | 10/2010 | Giovannotto |
| 2017/0366140 A1 * | 12/2017 | Jin .................. H03F 1/0288 |

OTHER PUBLICATIONS

Ercan Kaymaksut, et al.; "Transformer-Based Uneven Doherty Power Amplifier in 90 nm CMOS for WLAN Applications"; IEEE Journal of Solid-State Circuits, IEEE Service Center, vol. 47, No. 7, Jul. 1, 2012; pp. 1659-1671.

Applicant: GatesAir, Inc.; European Patent Application No. 18168897.9; European Search Report; Date of Completion: Sep. 11, 2018; 15 pgs.

* cited by examiner

PUSH-PULL AMPLIFICATION SYSTEMS AND METHODS

TECHNICAL FIELD

The present invention relates generally to electrical circuits, and specifically to power amplification systems and methods.

BACKGROUND

An electronic amplifier is a device for increasing the power of a signal. Generally, an amplifier outputs energy from a provided power supply and controls the output to match an associated shape of an input signal with a larger amplitude. There are many types of electronic amplifiers, which are commonly used in radio and television transmitters and receivers, high-fidelity stereo equipment, microcomputers and other electronic digital equipment, and audio amplifiers. Existing amplifier designs, such as traditional Doherty amplifiers, are able to operate with higher efficiency but for a limited range of bandwidth. In some applications, users desire amplifiers with increased bandwidth while maintaining the high efficiency they have come to expect.

SUMMARY

In one example, an amplification system includes a differential output circuit that provides an amplified output to drive a load. A main amplifier is coupled to a terminal of the differential output circuit via a main path, corresponding to a transmission line. A peak amplifier is coupled to another terminal of the differential output circuit via a peak path, corresponding to a transmission line. In a single-ended mode while the peak amplifier is deactivated for amplification purposes, the peak path performs an impedance inversion to effectively ground the other terminal of the differential output circuit. In a differential mode, each of the peak amplifier and the main amplifier operates to conduct current to respective terminals of the differential output circuit and each of the main path and the peak path provides a predetermined output impedance to the differential output circuit.

In another example, an amplification system includes a main transistor device series coupled with a peak transistor device. The main transistor device receives a main input signal at its gate from a first end of a secondary winding of an input transformer and the peak transistor device receives a second input signal that is out of phase with the first input signal from a second end of the secondary winding of the input transformer. A main path transmission line is coupled between the main transistor device and a first end of a primary winding of an output transformer. A peak path transmission line is coupled between the peak transistor device and a second end of the primary winding of the output transformer. The amplification system operates in a differential amplifier mode with the main and peak transistor devices alternately conducting to provide respective amplified signals to the first and second ends of the primary winding of the output transformer in response to the first and second signals and each of the main and peak path transmission lines drives an output impedance to the first and second ends of primary winding of the output transformer. The amplification system operates in a single-ended amplifier mode with the main transistor device conducting in response to the first input signal and disabling the peak transistor for amplification purposes, while the peak path transmission line performs impedance inversion to effectively ground the second end of the primary winding of the output transformer and the main path transmission line provides twice the output impedance to first end of the primary winding of the output transformer in the single-ended amplifier mode than the output impedance it provides in the differential amplifier mode.

As yet another example, a method includes splitting an RF input signal into main and peak input signals that are supplied to main and peak amplifiers, respectively. The method also includes operating main and peak amplifiers in a differential amplifier mode to alternately conduct current and provide respective amplified signals to respective inputs of an output transformer in response to the main and peak input signals, each of the main and peak amplifiers being coupled to its respective inputs of the output transformer via a respective transmission line to provide a corresponding output impedance to the inputs of the output transformer. The method also includes operating the main and peak amplifiers in a single-ended amplifier mode with the main amplifier conducting in response to the main input signal and disabling the peak amplifier for amplification purposes. In the single-ended mode, the transmission line of the peak amplifier performs impedance inversion to effectively ground its input of the output transformer and the main path transmission line provides twice the corresponding output impedance to its input of the output transformer in the single-ended amplifier mode than in the differential amplifier mode.

DETAILED DESCRIPTION

This disclosure relates to power amplification systems and methods. The approach disclosed herein can be employed to increase the efficiency of a radio frequency (RF) power amplifier, over a wide frequency range (wide bandwidth). As an example, an amplification system includes main and peak amplifiers coupled to a differential output circuit (e.g., an output transformer or balun) via a main path and a peak path, respectively. Each of the main path and the peak path corresponds to a transmission line having a respective impedance. As used herein, for example, a transmission line can correspond to an electrically conductive trace on a printed circuit board, a coaxial cable or other electrical connection. The electric length of the main path transmission line can be set to an even integer multiple of a quarter wavelength and the electric length of the peak path transmission line can be set to an odd integer multiple of a quarter wavelength.

During high level operation of the system, both the main amplifier and the peak amplifier are ON to conduct current to the differential output. Each of the main path and peak paths operate with their desired output impedance, which enables the system to effectively double its output power provided at its output to the load. During low level operation, the main amplifier is also ON but the peak amplifier is OFF. When the peak amplifier is OFF, the transmission line in the peak path performs an impedance inversion from infinite (e.g., open circuit) at the output of the peak amplifier to zero (e.g., short circuit) at the other side of the transmission line where it is connected to the differential output. The impedance inversion effectively grounds the differential output circuit, which doubles the output impedance presented to the main amplifier to increase efficiency during such single-ended operation. By adjusting the impedance associated with each of the main and peak amplifiers, the amplifier systems and methods disclosed herein thus implement balanced impedance modulation for broadband operation without additional active devices.

Figure 1:
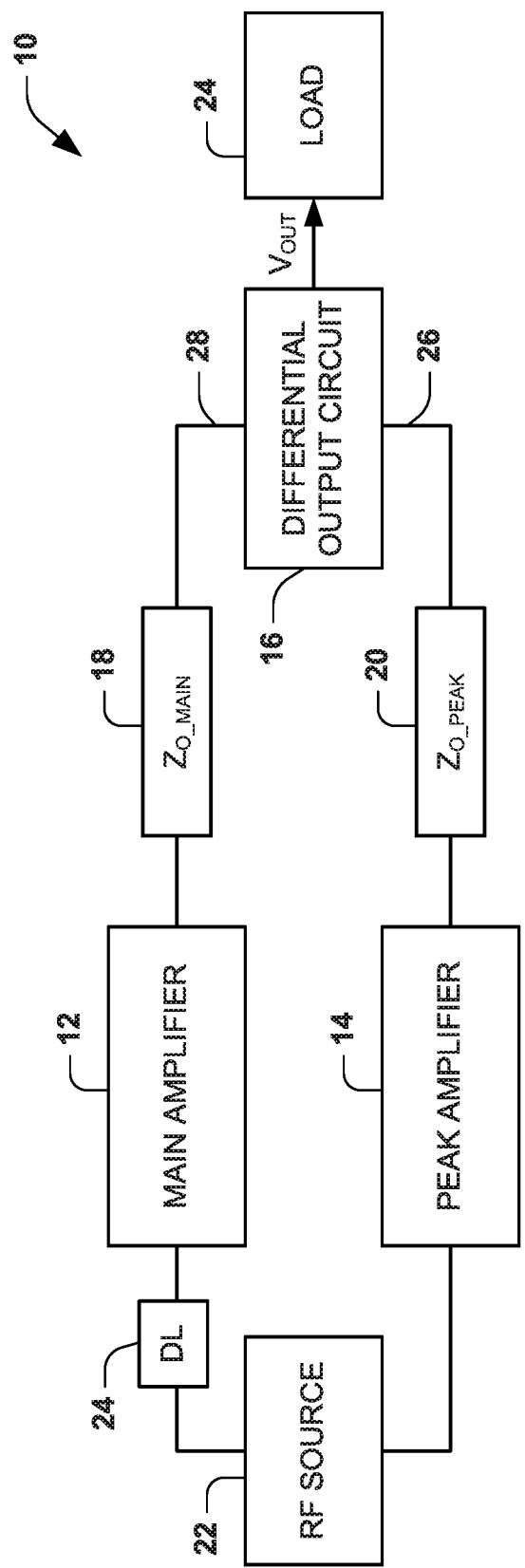
FIG. 1 depicts an example block diagram of an amplification system.

FIG. 1 depicts an example of an amplification system 10 that affords high efficiency over a broad range of frequencies. The system 10 includes a main amplifier 12 and a peak amplifier 14 that are coupled to drive in differential output circuit 16. The main amplifier 12 is connected to the differential output circuit 16 through a path corresponding to a transmission line 18, demonstrated at $Z_{O\_MAIN}$. The peak amplifier 14 is similarly connected to another input of the differential circuit 16 via a peak path transmission line represented at $Z_{O\_PEAK}$.

As disclosed herein, each of the main and peak transmission lines 18 and 20 can have an electrical length that is an integer multiple of the quarter wavelength. For example, the electrical length of the main path 18 can be set to an even integer multiple of the quarter wavelength and the peak path transmission line 20 can have an electrical length that is set to an odd integer multiple of the quarter wavelength. As a further example, for VHF frequencies (e.g., 30 to 300 MHz), the electrical length of transmission line 18 can be set to or as close to zero as practicable and the peak transmission line length can be set to one quarter wavelength. For the example of UHF frequencies (300 to 3000 MHz) the electrical length of the main transmission line 18 may be set to two quarter-wavelengths and the electrical length of the peak transmission line may be set to three times one-quarter wavelength. Other electrical lengths can be utilized in other examples.

As shown in example of FIG. 1, an RF source 22 supplies respective input signals to the main amplifier 12 and to the peak amplifier 14. For instance, an input signal generated by the RF source 22 may be split to provide the respective input signals to the main and peak amplifiers 12 and 14. A delay line 24 may be connected between the RF source 22 and the input of the main amplifier 12. The delay line 24 implements a time difference (phase change on the RF signal, such that the input signal to the main amplifier has a predetermined phase relationship with respect to the input signal to the peak amplifier 14 according to the delay imposed by delay line 24 (e.g., approximately 180°—insertion phase of delay line). The delay line may be implemented as a combination of inductors and capacitors (LC networks), a transmission line or other circuit components.

The RF input signal can be in a variety of different amplitude and/or phase modulated forms. For example, the input signal can be a signal that conforms to WCDMA, multi-carrier GSM, OFDM or other signals having high peak-to-average power ratios (PAR). In response to the input signal from the RF source 22, differential output circuit 16 provides a corresponding output voltage $V_{OUT}$ to a corresponding load 24 that may be coupled to the amplification system 10.

The amplification system 10 can operate between a single-ended (low-level) operating mode and a differential (high-level) operating mode depending on the output voltage $V_{OUT}$ that is generated relative to the peak voltage envelope of the system. By way of example, during high-level of operation (e.g., the $V_{OUT}>\frac{1}{2} V_{PEAK}$), both the main and peak amplifiers 12 and 14 are ON in conducting current in response to the input signals provided by the source 22. During such high-level operation, the main path and peak path transmission lines 18 and 20 provide the desired output resistance, which may be referred to as $R_{OPT}$, at the inputs of the differential circuit 16. With both $Z_{O\_MAIN}$ 18 and $Z_{O\_PEAK}$ providing the desired output resistance in the differential operating mode, the power output of the amplification system 10 can double relative to the available output power in the single-ended operating mode.

The system 10 operates in its single-ended operating mode at low levels of the voltage envelope (e.g., $V_{OUT}<\frac{1}{2} V_{PEAK}$). At such low level operation, the peak amplifier 14 is OFF and the main amplifier 12 is ON and conducting current in response to the RF input signal. Additionally, the peak path transmission line 20 performs an impedance inversion from an infinite resistance at the output of the peak amplifier 14 to zero ohms presented at the peak input 26 of the differential circuit 16 at the other side of transmission line. The impedance inversion that occurs in response to the peak amplifier 14 being deactivated (e.g., turned OFF) results in effectively grounding the input 26 of the differential output circuit 16. Due to the grounding the input 26 (during such low-level operation), the output impedance of the main amplifier 12 presented at the main input 28 of the differential circuit 16 is doubled to afford high efficiency operation during the low level, single-ended operating mode of the system 10. Further, by configuring the electric length of each respective transmission line 18 and 20, the amplifier system 10 provides broadband balanced impedance modulation to enable high efficient operation across one or more frequency ranges. Additionally, by configuring the peak transmission line to perform such impedance inversion in the singled ended mode, broadband high efficiency operation can be achieved in the absence of any switch devices (e.g., transistors) in the peak path.

Figure 2:
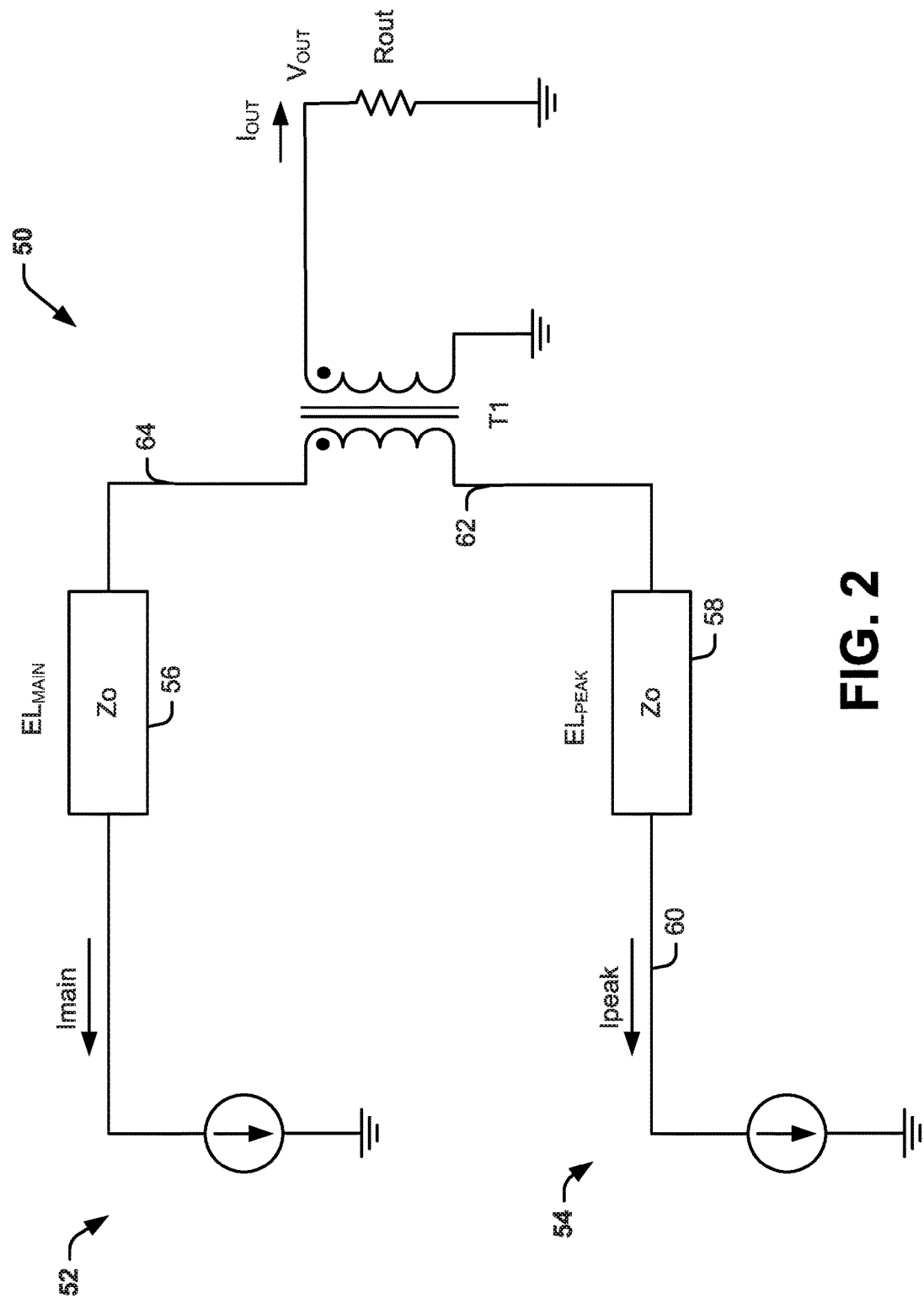
FIG. 2 depicts an example of a circuit diagram of an amplification system.
Figure 3:
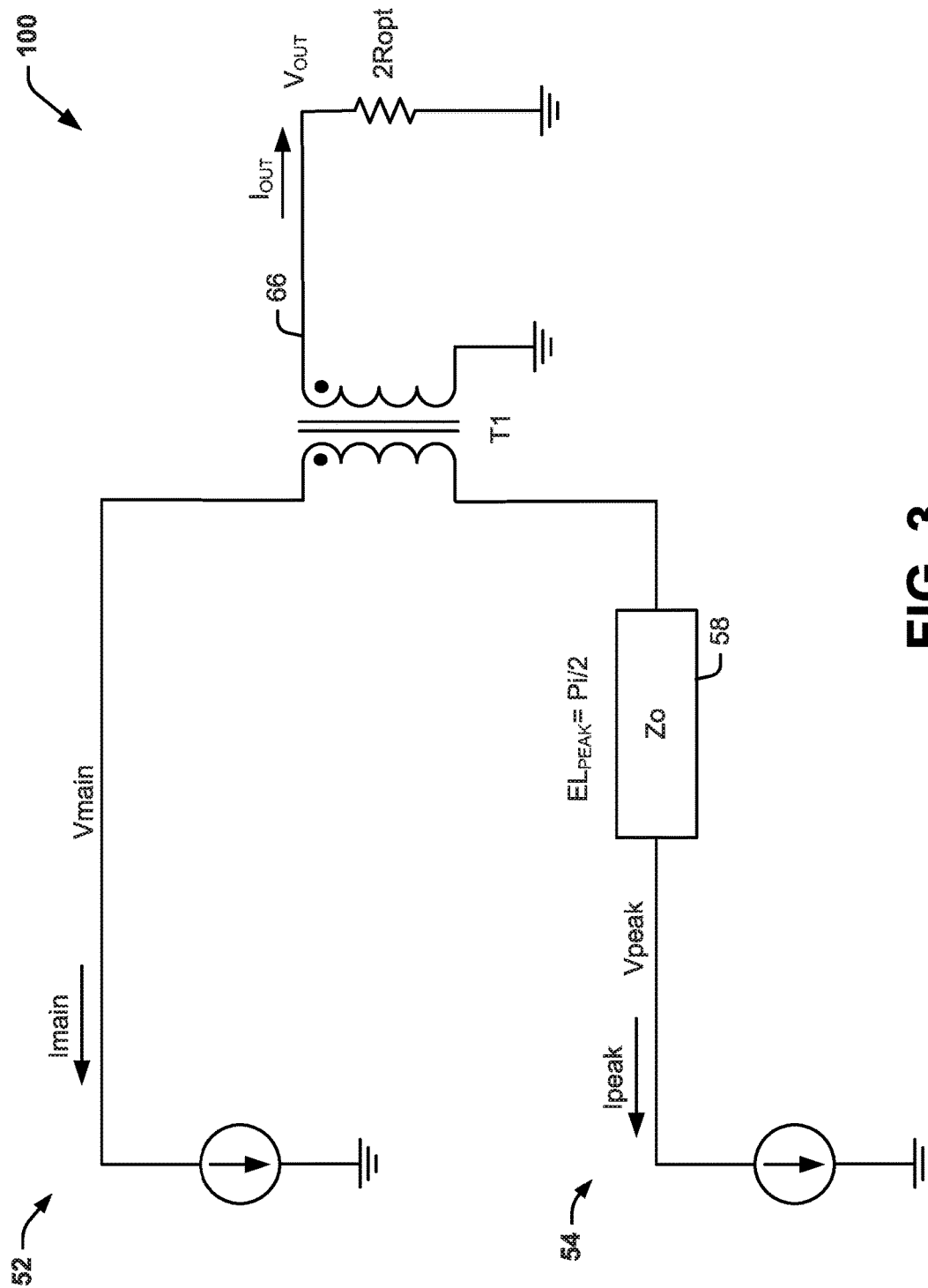
FIG. 3 depicts an example of the circuit of FIG. 2 where the value of n is set to zero.

FIGS. 2 and 3 depict a circuit diagram representation of an amplification system 50 for broadband high efficiency operation. In the examples of FIGS. 2 and 3, it is assumed that the amplifiers 52 and 54 operate as ideal current sources and thus provide infinite output impedance for each respective amplifier. The transformer T1 has a transformation ratio of N, where N defines the ratio between the number of primary and secondary windings. The transformation ratio can be configured to adjust for efficiency and operating requirements of the amplification system.

In the example of FIG. 2, the system 50 includes a main amplifier 52 and a peak amplifier 54. Each of the amplifiers 52 and 54 is represented as a current source that supplies respective current demonstrated as $I_{MAIN}$ and $I_{PEAK}$ for each of the peak and main amplifiers. Additionally, the main amplifier 52 is coupled to a primary winding of an output transformer T1 via a transmission line 56. The peak amplifier 54 is also coupled to the other primary input of the output transformer T1 via a transmission line 58. The output transformer T1 provides a transformed amplified version of input signal at its secondary winding according to its winding ratio. The output transformer T1 thus provides output current $I_{OUT}$ and output voltage $V_{OUT}$ to a system output load $R_{OUT}$ (e.g., 50 ohms).

Each of the main and peak transmission lines 56 and 58 has an electric length (EL) that is configured as an integer multiple of a quarter wavelength (e.g., λ/4, corresponding to Pi/2 or 90° electrical, where λ represents the wavelength). In the example of FIG. 2, the electrical length of the main transmission line 56 is set to an even integer multiple of the quarter wavelength, namely $EL\_{MAIN}=2n*Pi/2$. The electrical length of the peak transmission line 58 is set to an odd integer multiple of a quarter wavelength, namely $EL\_{PEAK}=(2n+1)*Pi/2$. The value of n for the electrical length of each of the main and peak transmission lines may be set according to an intended operating frequency of the amplification system 50. As disclosed herein, a given electrical length can enable high efficiency operation over a wider (e.g., more than double, such as about three times) frequency band than many existing amplifier topologies.

The current, $I_{MAIN}$ and $I_{PEAK}$, supplied by each of the main and peak amplifiers 52 and 54 are in response to the RF input signal input to the system, such as disclosed herein. Additionally, the amplifier system 50 operates in multiple amplifier modes, namely a single-ended (low level operation) mode and in a differential (high level operation) mode depending on the output voltage $V_{OUT}$ relative to the peak envelope afforded by the system 50. For instance, at amplifier saturation the output voltage $V_{OUT}$ oscillates between the positive and negative peak voltages according to voltage rails that supply power for the system 50.

Furthermore, during low level operation, the system 200 operates in its the single-ended mode and the main amplifier 52 will alternate between conducting and not conducting to provide a portion of the amplified version of the input signal to a primary winding of an output transformer T1. Additionally, during such low-level operation, the peak amplifier 54 is OFF. When the peak amplifier is OFF, the circuit components for peak amplifier including its transmission line 58 perform an impedance inversion from infinite impedance at 60 to zero ohms at the input of the transformer T1, demonstrated at 62. In response to the impedance inversion via the transmission line circuitry 58, a doubling of the output impedance (e.g., 2*Ropt) is presented to the main amplifier 52 at its respective input 64 of the transformer T1. This results in high efficiency operation during low level operation in a single-ended mode.

During high level operation, both main and peak amplifiers 52 and 54 are each ON to conduct current. Each of the respective transmission lines 56 and 58 operate at their desired output resistance levels (Ropt) at 62 and 64, thereby doubling the output power for the amplification system 50 relative to the signal-ended mode. The amplifier system 50 may repeatedly switch operating between differential and single-ended modes as the output voltage Vout changes resulting in balanced impedance modulation between such operating modes.

FIG. 3 depicts an example where the integer variable n (from the example of FIG. 2) is set equal to zero. With n=0, the electrical length of the main transmission line 56 ($EL\_{MAIN}$) approaches zero. In practice, however, for n=0, the transmission line between the main amplifier 52 and the output transformer T1 is to be made as short as possible. In the following example, it is assumed that transformer T1 has a transformation ratio of N=1. Other transformer ratios may be used to adjust for efficiency and operating requirements of the amplification system in other examples. In this example where n=0, the electrical length of the peak transmission line 58 ($EL\_{PEAK}=(2n+1)*Pi/2$) thus is set to Pi/2, corresponding to λ/4.

In the example of FIG. 3, the output impedance of the transformer output 66 is terminated with $2*R_{OPT}$ (2 times the optimum impedance) of the device. Thus, the impedance of the peak transmission line 58 $Z_0$ is equal to $R_{OPT}$, which is equal to the optimum impedance of the device. Additionally, the peak current $I_{PEAK}$ lags 90° with respect to the current $I_{MAIN}$ through the main amplifier 52. As a result of such consideration the circuit of FIG. 2 reduces to its representation shown in FIG. 3. With the operating parameters and configuration, as discussed above in FIG. 3, the following relationships between the resistance, current, and voltage for each of the main and peak amplifiers 52 and 54 can be represented as follows:

$$V_{main}=2 \cdot R_o \cdot I_{main} - j \cdot Z_o \cdot I_{peak} \qquad \text{EQ. 1}$$

$$V_{peak}=j \cdot Z_o \cdot I_{main} \qquad \text{EQ. 2}$$

$$V_1=-j \cdot Z_o \cdot I_{peak} \qquad \text{EQ. 3}$$

Furthermore, the output voltage $V_{OUT}$ can be represented as follows:

$$V_{out}=V_{main}-V_1=2 \cdot R_o \cdot I_{main} - j \cdot Z_o \cdot I_{peak} + j \cdot Z_o \cdot I_{peak} \qquad \text{EQ. 4}$$

$$V_{out}=2 \cdot R_o \cdot I_{main} \qquad \text{EQ. 5}$$

Figure 4:
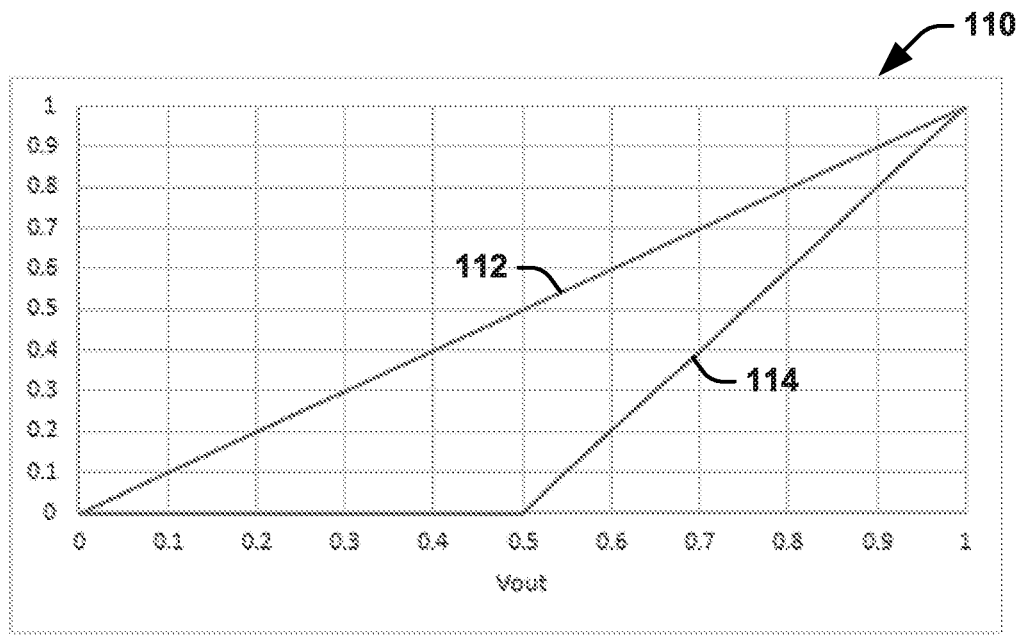
FIG. 4 is a graph representing the relationship of output voltage to peak and main current values.

Using the relationships for the situation where n=0 demonstrated in the example of FIG. 3, FIG. 4 depicts a graph 110 showing the relationship of main current 112 and peak current 114 relative to a normalized output voltage ($V_{OUT}$ at 66 in FIG. 3). As shown in FIG. 4, the peak current 114 does not begin to conduct until 0.5 of the normalized $V_{OUT}$. The main current 112 has a linear relationship across the range of output voltage from 0 to 1.

Figure 5:
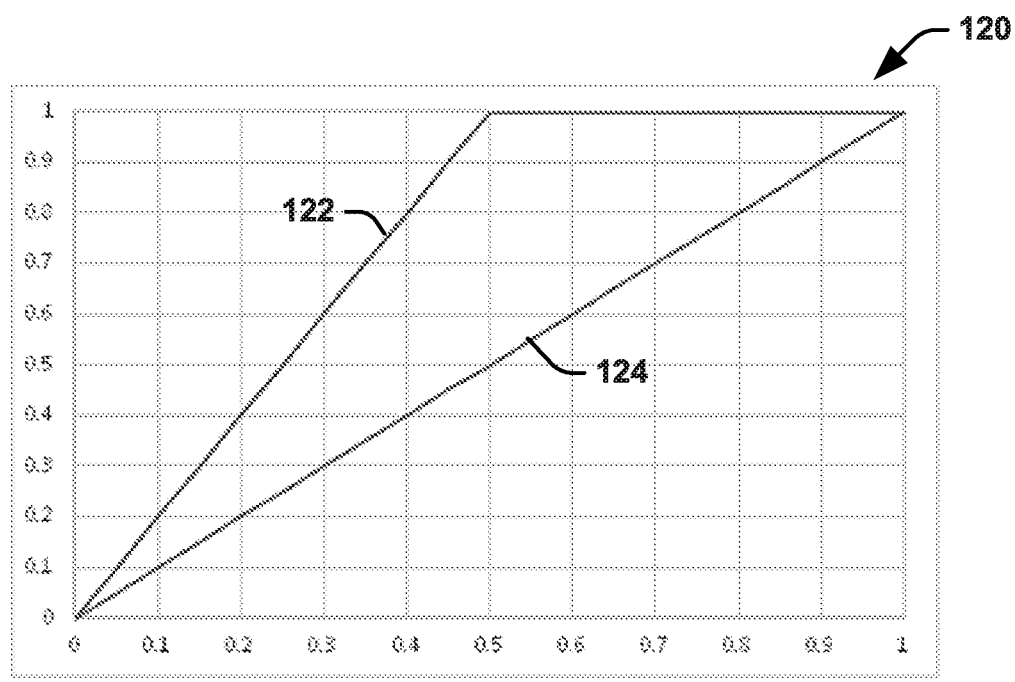
FIG. 5 is a graph representing the output voltage relative to the peak and main voltage levels.

FIG. 5 depicts another graph 120 showing the relationship of main voltage 122 and peak voltage 124 provided by respective amplifiers relative to a normalized output voltage. As shown in the graph 120 of FIG. 5, the main voltage 122 increases up to the one-half of $V_{OUT}$ where it levels out to the maximum $V_{OUT}$ (at saturation). The peak voltage 124 increases linearly from 0 up to the entire envelope of $V_{OUT}$.

As a further example, when the peak amplifier 54 is turned ON, which occurs at half the maximum voltage across the load (e.g., at $0.5 \cdot V_{out\_sat}$), the efficiency (η) can be expressed as follows:

$$\eta = \frac{\pi}{2} \cdot \frac{|I_{Main}|^2}{(|I_{Main}|+|I_{Peak}|)} \qquad \text{EQ. 6}$$

Figure 6:
FIG. 6 is a graph representing efficiency of the amplifier system over a range of output voltages.

FIG. 6 demonstrates a graph 130 demonstrating efficiency of the amplification system of FIG. 3 as a function of the output voltage according to EQ. 6 for efficiency. As demonstrated in FIG. 6, the efficiency reaches a maximum at about 6 db back off (e.g. of half the maximum output voltage) and then continues to stay at a high level for the remainder of the envelope excursion.

Figure 8:
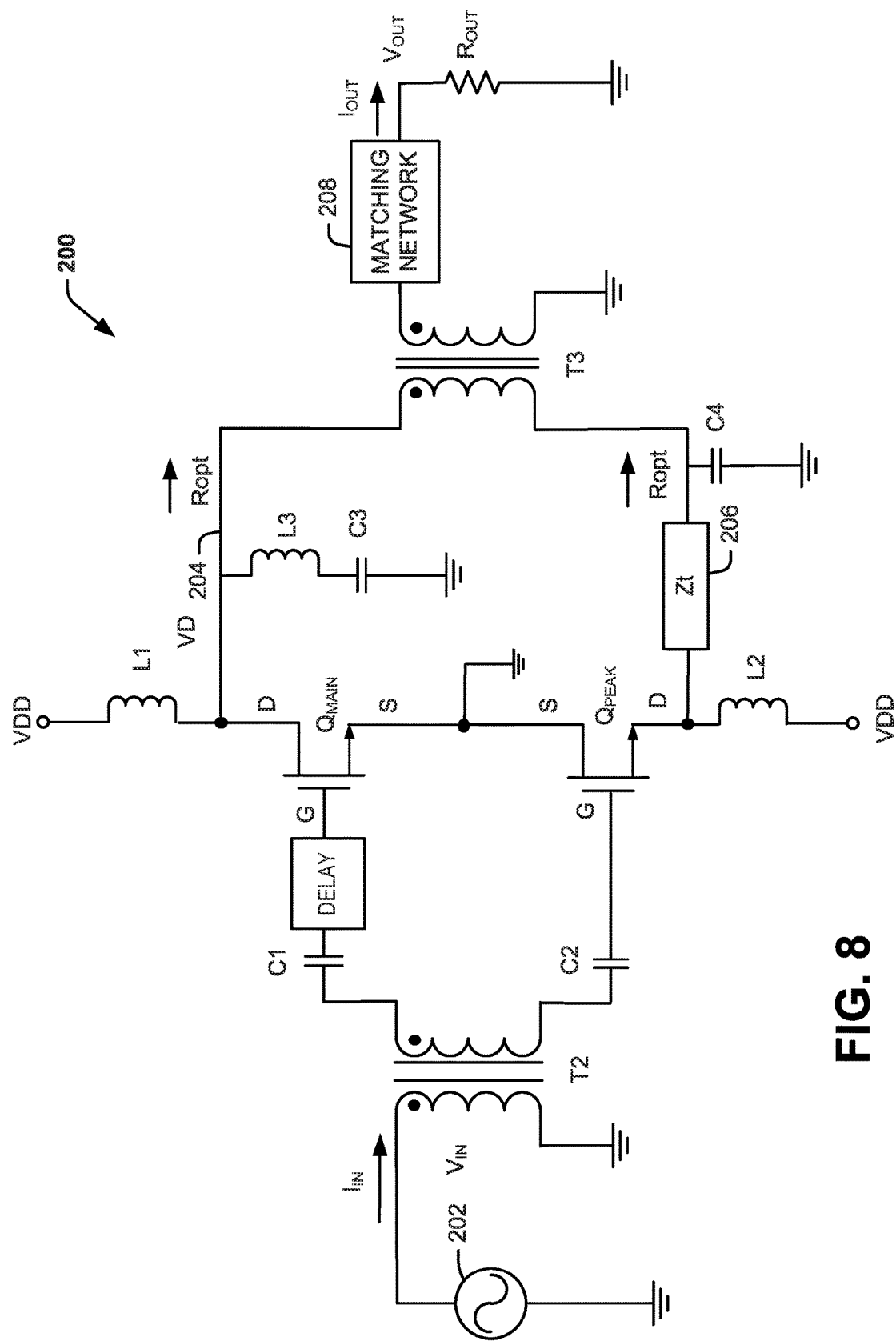
FIG. 8 is a circuit diagram for an amplification system for high level operation in both main and peak amplifiers are conducting.
Figure 9:
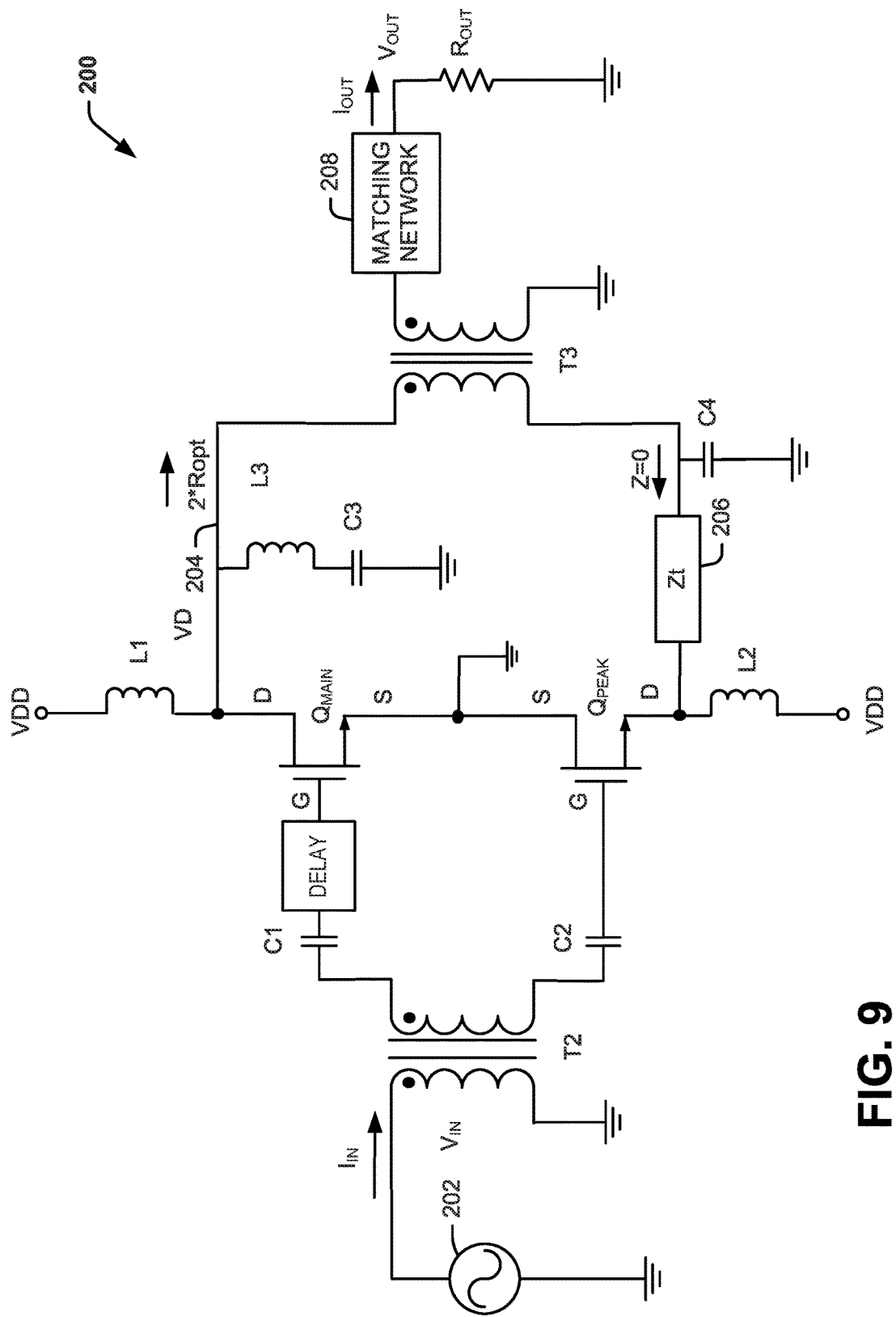
FIG. 9 is a circuit diagram of an amplification system demonstrating low level operation in which the main amplifiers conducting at a peak is OFF.

FIGS. 8 and 9 demonstrate circuit diagrams for an example amplifier system 200 demonstrating corresponding configuration, including impedance modulation, for its different modes of operation (e.g., differential operating mode in FIG. 8 and single-ended operating mode in FIG. 9). Identical reference characters refer to identical components in each of the FIGS. 8 and 9. The examples in FIGS. 8 and 9 correspond to a situation where n=0 similar to FIG. 3 disclosed above. It is understood that the amplification system could be implemented with other values of n, which may vary according to application requirements. As an example, for VHF frequencies, the application system 200 can be configured with transmission lines with the variable n=0. For UHF or other higher frequencies, the value of n can be set to 1 or other integers. Thus, the amplification system 200 can be configured to achieve broadband, high efficiency operation.

As described herein, the amplification system 200 switches between operation of a push-pull amplifier system amplifying in a push-pull amplifier (e.g., differential) mode and between amplifying in a single-ended amplifier mode according to the output voltage $V_{OUT}$ level (e.g., whether operating in low or high output envelope levels). For example, a low envelope level may be determined when $V_{OUT} < V_{OUT\_}sat/2$, corresponding to the single-ended mode, and a high envelope level occurs when $V_{OUT} > V_{OUT\_}sat/2$, corresponding to the differential operating mode. The system 200 may repeatedly switch operating between differential and single-ended modes as the output voltage $V_{OUT}$ changes. The threshold level for switching between operating modes may be adjusted by adjusting a corresponding DC bias that is applied to the gate of peak transistor device Qpeak.

An input signal is provided by an RF source 202, which provides an input current $I_{IN}$ to produce an input voltage $V_{IN}$ across the primary windings of an input transformer T2. The input current and voltage is transformed to a secondary winding of the input transformer T2 and split to provide about one-half of its output voltage as a first input signal to a gate of the main power transistor Qmain through capacitor C1 and delay line 203 and a second input signal, which establishes a properly phase relationship with respect to the first input signal, to be provided to a gate of a peak power transistor Qpeak through a capacitor C2.

Figure 7:
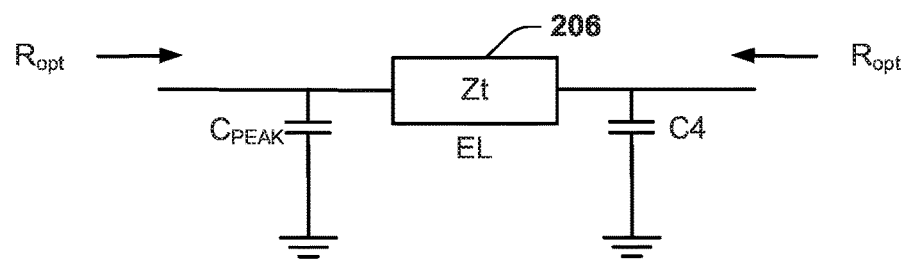
FIG. 7 is a circuit representation of a transmission line for the peak path of the amplifier circuit.

For example, the delay line 203, which is connected between the an end of the secondary of T2 and the gate of Qmain, implements a time difference (phase change on the RF signal, such that the input signal to the main amplifier may be out of phase (delayed) with respect to the input signal to the peak amplifier according to the delay imposed. With reference to FIG. 7, the delay line 203 may be configured to have an insertion phase equal to the insertion phase of the network formed by the output capacitance of the peak amplifier ($C_{PEAK}$), the impedance of the delay line (Zt) and capacitor C4. Thus, delay line can impose a delay to provide a phase relationship between the main and peak devices that is approximately 180°—insertion phase of delay line 203.

The push-pull amplifier system includes a first inductor L1 that couples a drain of the main power transistor Qmain to a DC power supply VDD and another inductor L2 that couples a drain of the peak power transistor Qmain to the DC power supply VDD. The drain of the main power transistor Qmain is directly connected to an input terminal of the primary of the output transformer T3. The drain of the peak power transistor Qpeak is also coupled to another terminal of the primary of the output transformer through a peak impedance path, corresponding to a transmission line 206. The secondary winding of the output transformer T3 is coupled to a system output load Rout (e.g., 50 ohms) through a matching network 208. The matching network The matching network 208 is configured to restore a missing portion of the transformed amplified version of the input signal and provide output current $I_{OUT}$ and output voltage $V_{OUT}$ to the system output load Rout.

As disclosed herein, during the push-pull (high-level) amplifier mode, each series coupled power transistor Qmain and Qpeak will see an output impedance of $R_{OPT}$, which is the optimum impedance to achieving maximum power and maximum efficiency. During the single-ended amplifier mode, however, the conducting transistor Qmain will drive an output impedance of 2*Ro (twice the optimum impedance). This doubling in working impedance for a Qmain enables it to operate at higher efficiency until the point at which the transistor device saturates. Therefore, the amplification system 200 employs a form of impedance modulation.

In the examples of FIGS. 8 and 9, it is assumed that each of Qpeak and Qmain is an ideal active device that operates as an ideal current source internal to the package after the device output capacitance Coss of each transistor and other internal connections are mathematically removed. Qmain is typically biased to operate in class AB linear mode. Qpeak is typically biased to operate in class C mode (by applying a DC bias at the gate of the peak device). As a result, Qpeak which will start to conduct only when the output voltage has reached or remains above one-half of its total expected excursion. For example, Qpeak is biased below a threshold voltage of conduction of the Qmain, such that Qpeak will start to conduct if the input signal applied to the gate of Qpeak exceeds a difference between the threshold voltage and the DC offset voltage.

In some circumstances, output capacitances associated with active devices (e.g., Qpeak and Qmain) tend to operate as band-limiting elements when implementing wideband power amplifiers, such as the amplifier system 200. A way to mitigate this effect is by absorbing these capacitances into other components in the network. In the example of FIG. 8, the output capacitances of Qpeak and Qmain can be mitigated by forming quasi-lumped version of the transmission peak and main transmission lines.

As an example, the output capacitance of Qpeak can be absorbed into its quarter wave line by using the topology shown in FIG. 7, where the electrical length (EL) of the transmission line 206 can be represented as:

$$EL = \arccos(wo \times C \times R_{OPT}) \quad \text{EQ. 7}$$

where wo is the radian frequency,
C is the value of the output capacitance, and
$R_{OPT}$ is the optimum output impedance of the transistor device.

The impedance of the transmission line 206 when Qpeak is ON (e.g., during high-level operation, as in FIG. 8), can be represented as:

$$Zt = Zo/\sin(EL) \quad \text{EQ. 8}$$

where Zt is the characteristic impedance of the transmission line with electrical length EL.

Thus, in this example, EL for the peak transmission line becomes less than a quarter wave, such as less than Pi/2.

Referring back to FIG. 8, a desired solution exists when n=0 and the associated output capacitance C3 is resonated out by a shunt inductor L3. Thus, as shown in FIG. 8, inductor L3 and capacitor C3 (used as DC block) are coupled in series between the drain of Qmain and ground. A capacitor C4 is coupled between the transformer-side of the peak transmission line 206 and ground. For the peak transistor Qpeak, transmission line 206 has an electric length and cooperates with active device Qpeak to present different impedances at the transformer T3 depending on whether Qpeak is ON or OFF (e.g., based on operating mode), such as disclosed herein. Similarly, transformer T3 presents an output impedance to Qmain that depends on the operating mode of the system 200 (e.g., high-level or low-level operation).

In examples where the system 200 operates at high envelope levels (e.g., $V_{out} > V_{out\_sat/2}$), demonstrated in FIG. 8, both Main and Peak devices are ON (e.g., conducting) to drive the output transformer T3 in the push-pull (differential) mode. In this mode, the output transformer T3 presents $2 \times R_{OPT}$ differentially across its terminals. The optimum impedance $R_{OPT}$ is then presented to each device Qmain and Qpeak. For Qmain, its output capacitance Coss is resonated by the shunt inductor L1 to present the optimum impedance $R_{OPT}$ to the Qmain. For Qpeak, its output capacitance Coss along with the transmission line Zo and C2 form a low pass filter tuned at the optimum impedance $R_{OPT}$ and across the desired operating bandwidth, as to present the value of $R_{OPT}$ to Qpeak.

In examples where the system 200 operates at low envelope levels (e.g., Vout<Vout_sat/2), as demonstrated in FIG. 9, only Qmain is ON (e.g., conducting) in a single-ended mode. The peak transistor Qpeak is turned OFF. For instance, Qpeak is OFF during the single ended mode since it is typically biased in class C, and Vgs_peak<(Vgs_threshold−Vgs_peak_bias, where Vgs_peak_bias is a DC bias (if any) applied to the gate of Qpeak). During such operation while Qpeak is OFF, the circuit formed by the Qpeak, the output capacitance (Coss) of Qpeak followed by the transmission Line 206 and C2 effectively grounds the lower terminal of the output transformer T3. This transformation of the peak output impedance can occur via impedance inversion that occurs for such circuit when Qpeak is OFF. The impedance inversion may result from via a quarter-wave transmission line, a quarter-wave quasi-lumped line, or lumped element quarter-wave transformer to represent a short in the output differential network at the peak-side terminal of output transformer T3. Additionally, when so configured while Qpeak is OFF, the circuit presents 2RL (twice the optimum impedance, 2*Ropt) to the main transistor Qmain. This doubling in working impedance for the Main device will make it operate at higher efficiency up to Vout_sat/2, at which point the device saturates. As the output envelope crosses the half-way point, the circuit is reconfigured from single-ended back to differential (push-pull) mode.

To help ensure the impedance is effectively doubled when the system 200 reconfigures from differential to single-ended mode, the differential circuit formed by the output transformer T3 and matching network 208 should have very high even mode impedance (e.g., at least approximately 5*Ropt, such as approximately 5-10 times the value of $R_{OPT}$ or more). The following is an example analysis demonstrating differences between using even and odd mode in the example system of FIGS. 8 and 9.

Excitation for the two modes for the main transistor:

$V_{even}=1$ and $V_{odd}=1$

Our unknown variable is the even mode impedance of the balun circuit under study:

$Z_{even}$=unknown

Accordingly, the even mode current is also an unknown:

$$I_{even} = \frac{V_{even}}{Z_{even}} = \text{unknown}$$

However, the odd mode impedance is known, as it is equal to the optimum Rout value, for proper push-pull (balanced) operation:

$Z_{odd}=R_{OUT}$

And accordingly the odd mode current is given by:

$$I_{odd} = \frac{V_{odd}}{Z_{odd}} = \frac{1}{R_{OUT}}$$

By superposition, the single-ended impedance is calculated as:

$$Z_{in} = \frac{V_{even} + V_{odd}}{I_{even} + I_{odd}} = \frac{1+1}{I_{even} + 1/R_L} = 2R_{OUT} \text{ (desired value)}$$

For the above expression to result in our desired value of $2R_{OUT}$ (effectively doubling the optimum impedance $R_{OPT}$), the unknown even current must be equal to 0. Thus, the even mode impedance is infinite, which confirms the requirement of very high $Z_{even}$ if the impedance is to double when reconfiguring from differential to single-ended operation.

Figure 10:
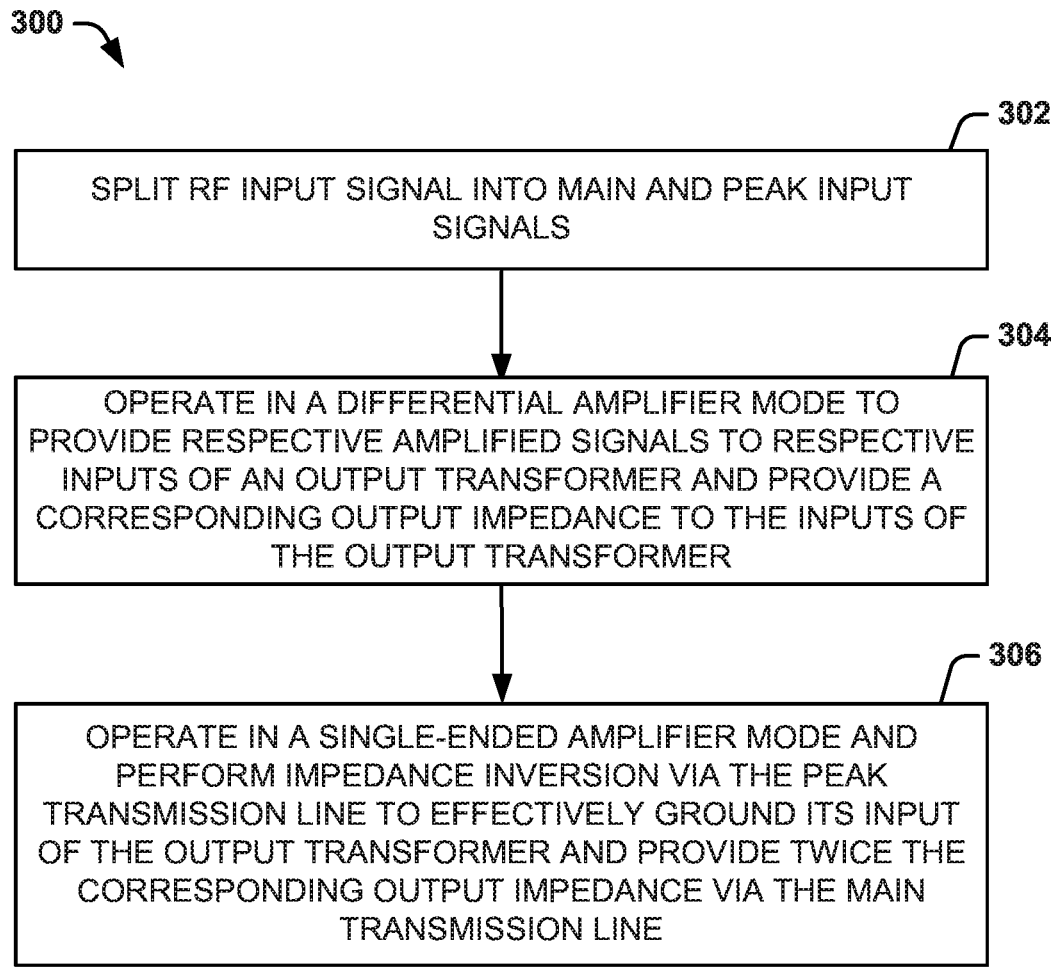
FIG. 10 is a flow diagram depicting an example method for amplifying an input.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention. The method can be implemented on hardware, such as including an integrated circuit, discrete components or a combination thereof.

FIG. 10 illustrates an example of a method 300 for amplifying an input signal with increased efficiency in an amplification system employing main and peak amplifiers (e.g., shown in FIGS. 1, 2, 3, 8 and 9). The method 300 begins at 302 where an RF input signal (e.g., from source 22 or 202) is converted (e.g., by input transformer T2) into main and peak input signals that are supplied to main and peak amplfiers, respectively.

At 304, the amplifier operates in a differential amplifier mode. For example, main and peak amplifiers alternately conduct current and provide respective amplified signals to respective inputs of an output transformer in response to the main and peak input signals. Additionally, each of the main and peak amplifiers is coupled to its respective inputs (e.g., of primary windings) of the output transformer via a respective transmission line to provide a corresponding output impedance (e.g., $R_{OPT}$) to the inputs of the output transformer.

At 306, the amplifier operates in a single-ended amplifier mode with the main amplifier conducting (ON) in response to the main input signal and the second power amplifier being disable (OFF) for amplification purposes. Additionally in the singled-ended amplifier mode, the transmission line of the peak amplifier (e.g., coupling the peak amplifier and its primary winding of the output transformer) performs impedance inversion to effectively ground its input of the output transformer. The main path transmission line further provides twice the corresponding output impedance (e.g., $2*R_{OPT}$) to its input of the output transformer in the single-ended amplifier mode than in the differential amplifier mode. As a result, the method can thus implement balanced impedance modulation for high efficiency broadband operation without additional active devices associated with the transmission line in the peak path.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplification system comprising:
   a differential output circuit that provides an amplified output to drive a load;
   a main amplifier coupled to a first terminal of the differential output circuit via a main path, corresponding to a transmission line; and
   a peak amplifier coupled to second terminal of the differential output circuit via a peak path, corresponding to another transmission line,
   wherein the transmission line of the main path has an electrical length that approximates an even integer multiple of a quarter wavelength and the transmission line of the peak path has an electrical length that approximates an odd integer multiple of a quarter wavelength,
   wherein, in response to the amplified output being less than a threshold level, the main amplifier operates to conduct current in a single-ended mode with respect to the differential output circuit while the peak amplifier is deactivated for amplification purposes, and the peak path adapted to perform an impedance inversion to electrically ground the second terminal of the differential output circuit through the peak path, and
   wherein, in response to amplified output being greater than or equal to the threshold level, each of the peak amplifier and the main amplifier operates in a differential mode to conduct current to respective first and second terminals of the differential output circuit, and each of the main path and the peak path is presented a same predetermined impedance at the first terminal and the second terminal, respectively, by the differential output circuit.

2. The amplification system of claim 1, wherein the electrical length ($EL_{MAIN}$) of the main path approximates $EL_{MAIN}=2n*Pi/2$, where n is 0 or a positive integer, and the electrical length ($EL_{PEAK}$) of the peak path approximates $EL_{PEAK}=(2n+1)*Pi/2$.

3. The amplification system of claim 2, further comprising a radio frequency (RF) source to supply input signals to each of the main amplifier and the peak amplifier, wherein the input signals have a frequency that ranges from about 30 MHz to about 300 MHz, and n=0.

4. The amplification system of claim 2, further comprising a radio frequency (RF) source to supply input signals to each of the main amplifier and the peak amplifier, wherein the input signals have a frequency that ranges from about 300 MHz to about 3000 MHz, and n=1.

5. The amplification system of claim 1, further comprising a radio frequency (RF) source to supply RF input signals to each of the main amplifier and the peak amplifier.

6. The amplification system of claim 5, wherein the RF input signal provided to the main amplifier is a main input signal and the RF input signal to the peak amplifier is a peak input signal, the main and peak input signals being out of phase with each other, and
   wherein the main amplifier further comprises a main transistor device and the peak amplifier further comprises a peak transistor device, each of the main and peak transistor devices having drains coupled to a DC power supply and sources coupled to electrical ground, the main input signal provided to a gate of the main transistor device and the peak input signal provided to a gate of the peak transistor device.

7. The amplification system of claim 6, wherein the peak transistor device is biased below a threshold voltage of conduction of the main transistor device at a DC offset voltage to bias the second power transistor in a class C configuration, such that if the peak input signal exceeds a difference between the threshold voltage and the DC offset voltage, the peak transistor device conducts and if the peak input signal is less than the difference, the second power transistor does not to conduct.

8. The amplification system of claim 5, further comprising an input transformer between the RF source and each of the main amplifier and the peak amplifier, the input transformer transforming the RF input signal to provide main and peak input signals that are out of phase with each other, the main input signal being supplied to the main amplifier and the peak input signal that is supplied to the peak amplifier.

9. The amplification system of claim 1, wherein when the main amplifier is operating in the single-ended mode and the peak path grounds the second terminal of the differential output, twice the predetermined impedance is presented to the main amplifier via the main path.

10. The amplification system of claim 1, further comprising a capacitor connected between electrical ground and the second of the differential output circuit to which the peak path is coupled.

11. The amplification system of claim 1, wherein the transmission line of the peak path is configured as a quasi-lumped version of a transmission line to compensate for an output capacitance of the peak amplifier, the transmission line of the peak path has an electric length that is less than a quarter wavelength to provide a corresponding characteristic impedance thereof.

12. An amplification system comprising:
    a differential output circuit that provides an amplified output to drive a load;
    a main amplifier coupled to a first terminal of the differential output circuit via a main path, corresponding to a transmission line; and
    a peak amplifier coupled to second terminal of the differential output circuit via a peak path, corresponding to another transmission line,
    a radio frequency (RF) source to supply RF input signals to each of the main amplifier and the peak amplifier;
    an input transformer between the RF source and each of the main amplifier and the peak amplifier, the input transformer transforming the RF input signal to provide main and peak input signals that are out of phase with each other, the main input signal being supplied to the main amplifier and the peak input signal that is supplied to the peak amplifier, wherein the differential output circuit comprises an output transformer, the main path and the peak path being connected to respective primary winding terminals of the output transformer, the load being connected to a secondary winding of the output transformer, wherein, in response to the amplified output being less than a threshold level, the main amplifier operates to conduct current in a single-ended mode with respect to the differential output circuit while the peak amplifier is deactivated for amplification purposes, and the peak path adapted to perform an impedance inversion to electrically ground the second terminal of the differential output circuit through the peak path, and wherein, in response to amplified output being greater than or equal to the threshold level, each of the peak amplifier and the main amplifier operates in a differential mode to conduct current to respective first and second terminals of the differential output circuit, and each of the main path and the peak path is presented a same predetermined impedance at the first terminal and the second terminal, respectively, by the differential output circuit.

13. An amplification system comprising:

a main transistor device series coupled with a peak transistor device, the main transistor device receives a first input signal at its gate from a first end of a secondary winding of an input transformer and the peak transistor device receives a second input signal that is out of phase with the first input signal from a second end of the secondary winding of the input transformer;

a main path transmission line coupled between the main transistor device and a first end of a primary winding of an output transformer;

a peak path transmission line coupled between the peak transistor device and a second end of the primary winding of the output transformer;

wherein the main path transmission line has an electrical length that approximates an even integer multiple of a quarter wavelength and the peak path transmission line has an electrical length that approximates an odd integer multiple of a quarter wavelength;

the amplification system operating in a differential amplifier mode with the main and peak transistor devices alternately conducting to provide respective amplified signals to the first and second ends of the primary winding of the output transformer in response to the first and second signals and each of the main and peak path transmission lines provides an output impedance to the first and second ends of primary winding of the output transformer; and the amplification system operating in a single-ended amplifier mode with the main transistor device conducting in response to the first input signal and disabling the peak transistor device for amplification purposes, wherein the peak path transmission line performs impedance inversion to electrically ground the second end of the primary winding of the output transformer through the peak path and the main path transmission line provides twice the output impedance by first end of the primary winding of the output transformer in the single-ended amplifier mode than the output impedance it provides in the differential amplifier mode.

14. The amplification system of claim 13, wherein the electrical length ($EL\_{MAIN}$) of the main path transmission line approximates $EL\_{MAIN} = 2n*Pi/2$, where n is 0 or a positive integer, and the electrical length ($EL\_{PEAK}$) of the peak path transmission line approximates $EL\_{PEAK} = (2n+1)*Pi/2$.

15. The amplification system of claim 14, wherein n=0 or n=1.

16. The amplification system of claim 13, wherein the peak path transmission line is configured as a quasi-lumped version of a transmission line to compensate for an output capacitance of the peak amplifier.

17. The amplification system of claim 13, further comprising a radio frequency (RF) source to supply an RF input signal to a primary winding of the input transformer.

* * * * *